(12) United States Patent
Alzheimer et al.

(10) Patent No.: US 11,848,067 B2
(45) Date of Patent: Dec. 19, 2023

(54) APPARATUS INCLUDING INTERNAL TEST MECHANISM AND ASSOCIATED METHODS

(71) Applicant: Micron Technology, Inc., Boise, ID (US)

(72) Inventors: Joshua E. Alzheimer, Boise, ID (US); Galaly Ahmad, Boise, ID (US); Cory J. Kuffner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 87 days.

(21) Appl. No.: 17/467,800

(22) Filed: Sep. 7, 2021

(65) Prior Publication Data
US 2023/0072895 A1 Mar. 9, 2023

(51) Int. Cl.
| | | |
|---|---|---|
| *G11C 29/36* | (2006.01) | |
| *G11C 29/10* | (2006.01) | |
| *G11C 29/42* | (2006.01) | |
| *G11C 29/12* | (2006.01) | |

(52) U.S. Cl.
CPC .......... *G11C 29/36* (2013.01); *G11C 29/10* (2013.01); *G11C 29/1201* (2013.01); *G11C 29/42* (2013.01); *G11C 2029/3602* (2013.01)

(58) Field of Classification Search
CPC ..... G11C 29/36; G11C 29/10; G11C 29/1201; G11C 29/42; G11C 2029/3602
See application file for complete search history.

(56) References Cited

U.S. PATENT DOCUMENTS

| | | | | |
|---|---|---|---|---|
| 4,980,888 A * | 12/1990 | Bruce | ...................... | G11C 29/40 714/E11.178 |
| 6,684,356 B2 * | 1/2004 | Raad | ...................... | G11C 29/44 714/719 |
| 2003/0237033 A1 * | 12/2003 | Borri | ...................... | G11C 29/14 714/718 |
| 2005/0210179 A1 * | 9/2005 | Walmsley | ............. | G06F 21/445 711/3 |
| 2005/0242836 A1 * | 11/2005 | Goetting | ............ | G01R 31/3167 326/39 |
| 2011/0041017 A1 * | 2/2011 | Zhong | ...................... | G06F 11/25 714/724 |
| 2021/0304835 A1 * | 9/2021 | Fujiwara | ................. | G11C 29/18 |
| 2022/0366996 A1 * | 11/2022 | Chiang | ................... | G11C 29/42 |

* cited by examiner

*Primary Examiner* — Tuan T Nguyen
(74) *Attorney, Agent, or Firm* — Perkins Coie LLP

(57) ABSTRACT

An apparatus including a test validation circuit and associated systems and methods are disclosed herein. The apparatus may include a self-test circuit configured to implement at least a portion of a self-test process that determines operating conditions of the apparatus. The test validation circuit may be configured to generate a flag based on comparing (1) an input stream or a portion thereof associated with the self-test to (2) test data associated with the self-test. The flag may represent a validity associated with the implementation of the self-test process or the portion thereof.

12 Claims, 5 Drawing Sheets

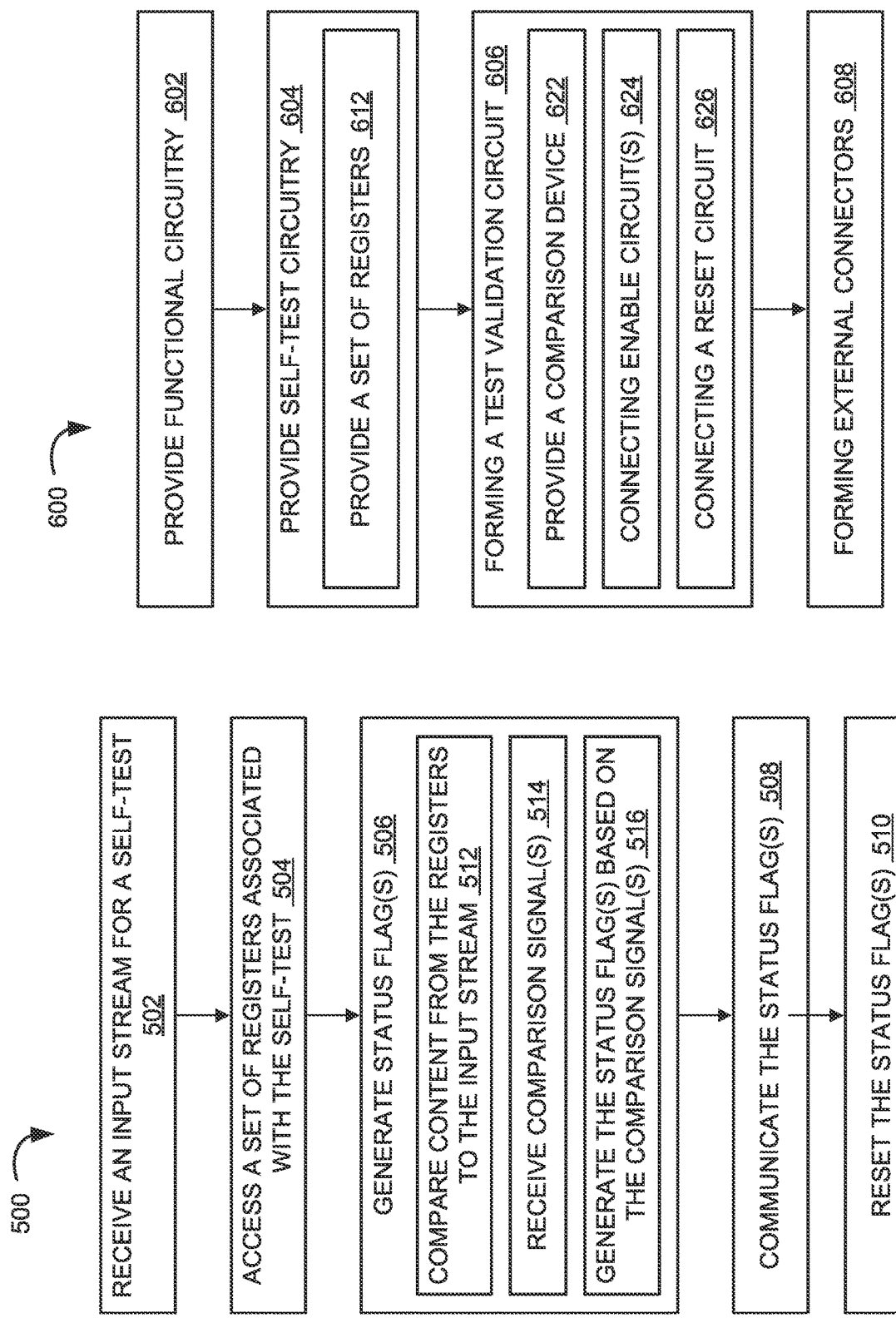

US 11,848,067 B2

APPARATUS INCLUDING INTERNAL TEST MECHANISM AND ASSOCIATED METHODS

TECHNICAL FIELD

The present technology is directed to apparatuses, such as semiconductor devices including memory and processors, and several embodiments are directed to semiconductor devices that include internal test mechanisms.

BACKGROUND

An apparatus (e.g., a processor, a memory device, a memory system, or a combination thereof) can include one or more semiconductor circuits configured to store and/or process information. For example, the apparatus can include a memory device, such as a volatile memory device, a non-volatile memory device, or a combination device. Memory devices, such as dynamic random-access memory (DRAM) and/or high bandwidth memory (HBM), can utilize electrical energy to store and access data.

With technological advancements in embedded systems and increasing applications, the market is continuously looking for faster, more efficient, and smaller devices. To meet the market demands, the semiconductor devices are being pushed to the limit with various improvements. Improving devices, generally, may include increasing circuit density, increasing operating speeds or otherwise reducing operational latency, increasing reliability, increasing data retention, reducing power consumption, or reducing manufacturing costs, among other metrics. However, attempts to meet the market demands, such as by reducing the overall device footprint, can often introduce challenges in other aspects, such as for maintaining circuit robustness and/or failure detectability.

BRIEF DESCRIPTION OF THE DRAWINGS

FIG. 5 is a flow diagram illustrating an example method of operating an apparatus in accordance with an embodiment of the present technology.

FIG. 6 is a flow diagram illustrating an example method of manufacturing an apparatus in accordance with an embodiment of the present technology.

DETAILED DESCRIPTION

As described in greater detail below, the technology disclosed herein relates to an apparatus, such as for memory systems, systems with memory devices, related methods, etc., for facilitating self-tests. An apparatus (e.g., a memory device, such as an HBM and/or a RAM, and/or a corresponding system) can include an internal mechanism (e.g., an internal test analyzer) configured to validate and/or latch test data. The internal mechanism can validate the test data to provide a higher-level summary of the communicated test data, thereby reducing the overall amount of data exchanged with an external device (e.g., an external tester) for the test. The internal mechanism can also selectively latch one or more portions of the test data, such as upon detecting specific test results, thereby improving the timing and efficiency associated with external communications.

Conventional devices (e.g., conventional HBM devices) are typically configured to implement a self-test, such as through a built-in self-test (BIST) circuitry/function. An external tester interacts with the BIST circuit to implement the test, and a test result message is read back to the external tester for analysis. For example, some HBM devices send values stored in BIST status registers and/or other related registers (e.g., multiple-input shift register (MISR)) at the end of the test. Typically, the communicated data (e.g., the data from the BIST registers and/or the MISR signatures) are highly likely to deviate from expected values when the test uncovers a failure. Such conventional design places a limit on the minimum duration per test based on the overhead required for the read-back, and thus place limitations on minimum test-time capabilities. In other words, limited memory of the tester requires overhead associated with additional/segmented communications and comparisons. Given the size of the test results (e.g., 1564 bits and 968 bits per channel), the communication and off-memory comparison may require significant amount of time (e.g., 40-50 ms per test). When extrapolated over significant portions of the device (e.g., per wafer), the resulting overhead time can correspond to tens of minutes to over an hour.

In contrast, the embodiments of the apparatus in accordance with the present technology can include the internal mechanism that analyzes the test results within the apparatus and providing a higher-level summary of the test results to the external tester. In some embodiments, the internal mechanism can include a set of registers and comparison circuitry (e.g., XOR gates) to hold expected data and compare it to the final test data. The internal mechanism can further include two or more comparison circuits each configured to analyze a corresponding aspect (e.g., a specific data pattern) of the test results.

Example Environment

Figure 1:
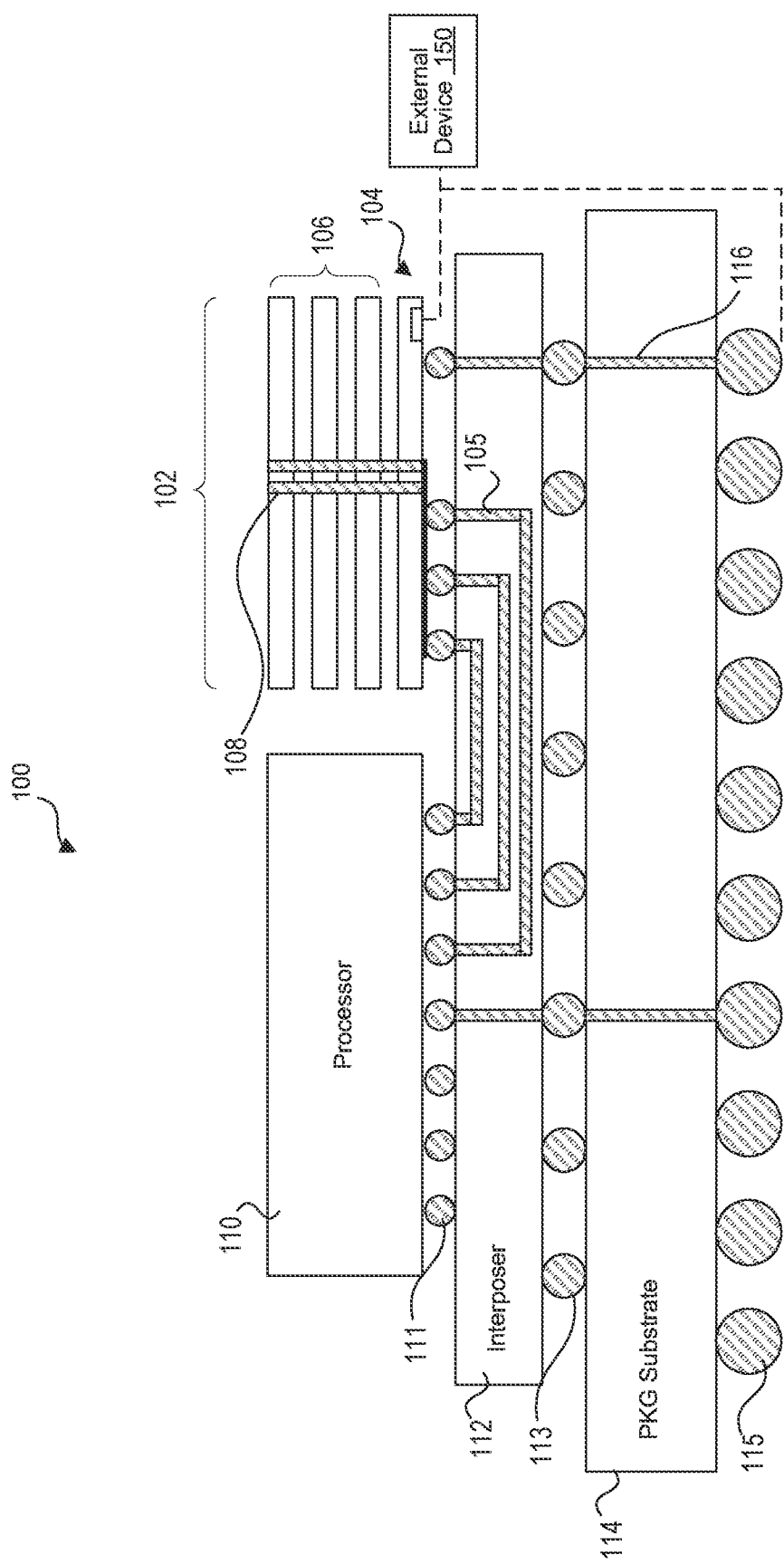
FIG. 1 is a cross-sectional view of a system-in-package device in accordance with embodiments of the technology.

FIG. 1 illustrates a schematic cross-sectional view of a system-in-package (SiP) device 100 (i.e., an example apparatus) in accordance with embodiments of the technology. The SiP 100 can include the memory device 102 and the processor 110, which are packaged together on a package substrate 114 along with an interposer 112. The processor 110 may act as a host device of the SiP 100.

In some embodiments, the memory device 102 may be an HBM device that includes an interface die (or logic die) 104 and one or more memory core dies 106 stacked on the interface die 104. The memory device 102 can include one or more through silicon vias (TSVs) 108, which may be used to couple the interface die 104 and the core dies 106.

The interposer 112 can provide electrical connections between the processor 110, the memory device 102, and/or the package substrate 114. For example, the processor 110 and the memory device 102 may both be coupled to the interposer 112 by a number of internal connectors (e.g., micro-bumps 111). The interposer 112 may include channels 105 (e.g., an interfacing or a connecting circuit) that electrically couple the processor 110 and the memory device 102 through the corresponding micro-bumps 111. Although only three channels 105 are shown in FIG. 1, greater or fewer numbers of channels 105 may be used. The interposer 112 may be coupled to the package substrate by one or more additional connections (e.g., intermediate bumps 113, such as C4 bumps).

The package substrate 114 can provide an external interface for the SiP 100. The package substrate 114 can include external bumps 115, some of which may be coupled to the processor 110, the memory device 102, or both. The package substrate may further include direct access (DA) bumps coupled through the package substrate 114 and interposer 112 to the interface die 104.

In some embodiments, the direct access bumps 116 (e.g., one or more of the bumps 115) and/or other bumps may be organized into a probe pad (e.g., a set of test connectors). An external device 150, such as a tester, may be coupled onto the probe pad in order to directly communicate with the memory device 102. In other words, the external device 150 may send signals to and/or receive signals from the memory device 102 without the signals passing through the processor 110 after the memory device 102 is mounted on the interposer 112. The external device 150 may be used to test the memory device 102 before it is mounted on the interposer 112 and/or coupled to the processor 110.

The external tester can function as a host device for the test that interacts with a built-in self-test (BIST) circuit of the memory device 102 to implement the test. The tester may be used to load one or more test patterns into a test pattern memory (e.g., predetermined registers) of the interface die 104. The tester may then provide one or more test instructions along the direct access terminals 116. The interface die 104 may perform one or more tests on the memory device 102 based on the test instructions and the loaded test patterns and may generate result information. The test results can be monitored during the test to find when failure occurs or read at the end of the test for a pass/fail conclusion.

The test patterns and the instructions can correspond to one or more tests performed on the memory device 102. The test may involve loading a pattern of data into one or more memory cells of the memory device 102 as part of a write operation, retrieving the stored information from the memory cells as part of a read operation, and comparing the written data to the read data. A test may be performed using the BIST circuit of the memory device 102. The tests may be performed using extremely long test patterns with random characteristics, which may require more storage space than is practical in the BIST circuit. Such tests may be performed by directly sending test patterns and instructions through the DA terminals 116.

Example Circuitry

Figure 2:
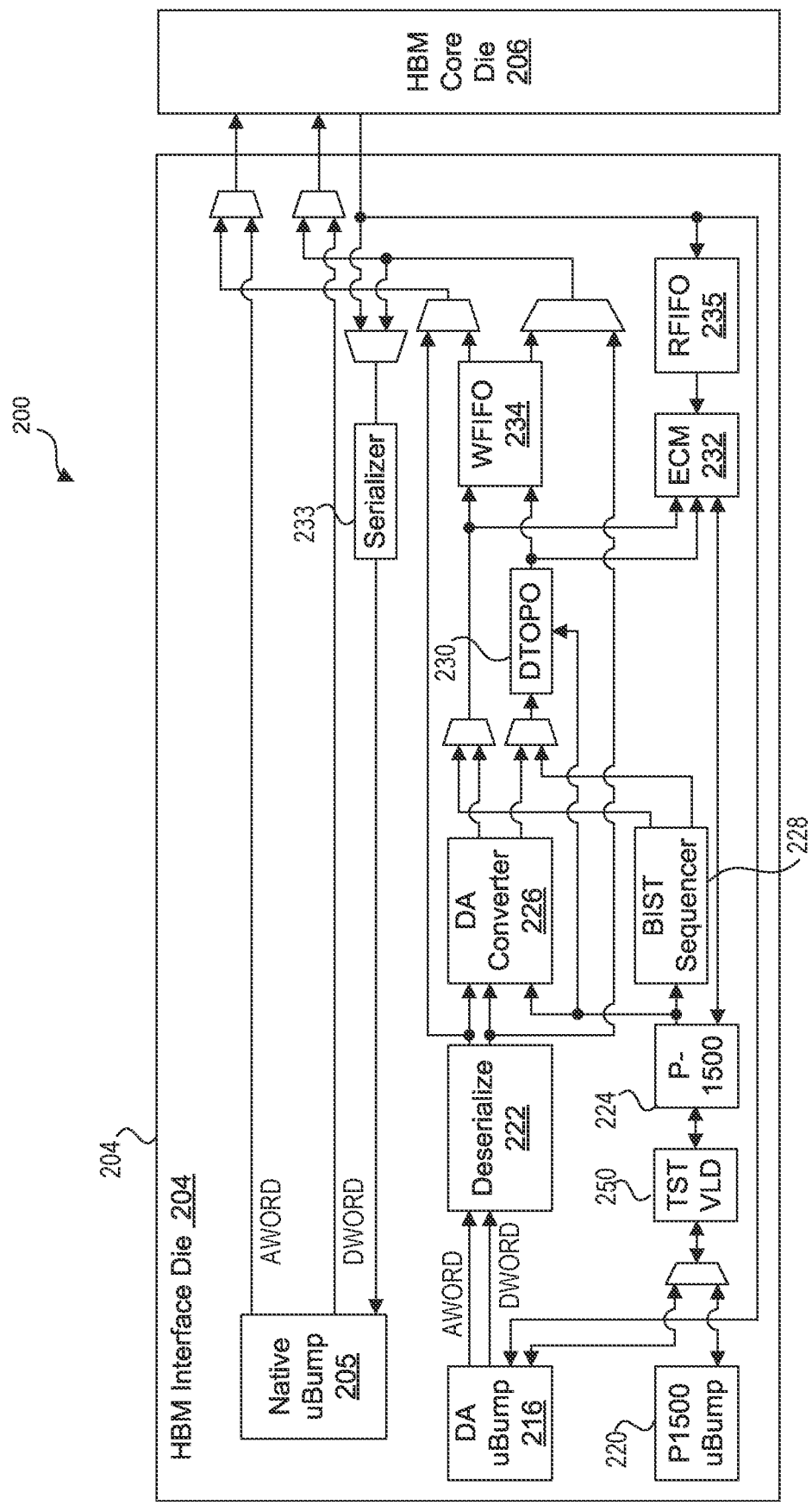
FIG. 2 is a block diagram of a memory device in accordance with embodiments of the technology.

FIG. 2 is a block diagram of a memory device 200 (i.e., an example apparatus, such as the memory device 102 of FIG. 1 or a portion thereof) in accordance with embodiments of the technology. The memory device 200 may include an interface die 204 and one or more core dies 206. For clarity, only a single core die 206 is shown in FIG. 2, however it should be understood that multiple core dies 206 may be coupled to the interface die 204 (e.g., there may be 2, 7, or other quantities of core dies 206).

The memory device 200 can include different interface terminals for accessing the core die(s) 206 and/or one or more circuits of the memory. In some embodiments, the different interface terminals can include native micro-bumps (uBumps) 205, DA uBumps 216, and/or test interface uBumps 220. The test interface uBumps 220 may be part of a specific interface protocol, such as the IEEE 1500 interface (also referred to as a P1500 interface). The native uBumps 205 may, in some embodiments, be included in the uBumps 111 of FIG. 1. The native uBumps 205 may be coupled to a processor (e.g., the processor 110 of FIG. 1) via one or more connections (e.g., the channels 105 of FIG. 1). The native uBumps 205 and the connections can enable the processor to access information (via, e.g., read or write operations and the corresponding exchange of information) in the core die(s) 206. For example, the core dies 206 may receive a command (e.g., a read command) along with address information (AWORD), such as such as a row address, column address, a bank address, a die identifier, or the like, that specifies a location for the memory access. The AWORD may also include command information, such as clock signals used for the timing of operations and command identifiers. The accessed information (DWORD), such as the write data or the read data can also be exchanged through the native uBumps 205.

In some embodiments, the interface die 204 may include a serializer 233 configured to process the DWORD between the core dies 206 to the native uBumps 205. For example, the serializer 233 may receive information in parallel along a first number of data lines (e.g., from the core 206), and then provide that information in a serial fashion along a second number of data lines (e.g., to the native uBumps 205). The serializer 233 may be used to multiplex a number of outputs (e.g., from the core 206) to a smaller number of data lines (e.g., to the native uBumps 205).

In addition to the operational configurations (e.g., native operational mode) associated with the native uBumps 205, the memory device 200 can be configured to operate in a test mode (e.g., a BIST mode or other self-test modes). In test mode, the memory device 200 can determine one or more characteristics (e.g., signal responses, manufacturing defects, failure or error related aspects, or other aspects of the circuit) of the memory device 200. The memory device 200 may utilize the P1500 uBumps 220 and/or the DA uBumps 216 as the test interface. For example, the P1500 uBumps 220 may be used to communicate signals with the host device according to a predetermined sequence or protocol for sending and receiving signals.

The memory device 200 may use a BIST sequencer 228 to process the signals communicated through the P1500 uBumps 220 and/or the DA uBumps 216. The BIST sequencer 228 may be coupled to a test interface circuit 224 (e.g., a P1500 circuit) that is configured to interpret signals according to the P1500 protocol. For example, the P1500 circuit 224 may translate signals received at the P1500 uBumps into signals usable by other circuits of the memory device 200 and vice versa.

During a test mode (e.g., a BIST operational mode), instructions may be received (from, e.g., the external device 150 of FIG. 1) to operate the BIST sequencer 228 to perform a test of the memory device 200. The BIST sequencer 228 may generate a test sequence (e.g., a string of logical bits) to write to memory cells of the core die 206. The BIST sequencer 228 may include a number of registers which may be used to store addresses of memory cells to test as well as a test sequence. In some embodiments, the test sequence and/or addresses may be generated within the BIST sequencer 228 based on instructions. For example, the BIST sequencer 228 may perform a test on a certain address value, increment that address value by one, and then perform the test again. In some embodiments, to save space in the BIST sequencer 228, the BIST sequencer 228 may load the test sequences into a look-up-table, such as data topology (DTOPO) circuit 230. Each entry in the DTOPO circuit 230 may be associated with a pointer value (e.g., an index value) and in a manner similar to the addresses the BIST sequencer 228 may generate a sequence of pointer values.

During a write portion of a test, the BIST sequencer 228 may provide address information (e.g., one or more row and column addresses) and a test sequence (e.g., data to be written to the memory cells specified by the address information) to an input buffer 234 (e.g., a register, such as a write FIFO (WFIFO)). In some embodiments, the BIST sequencer 228 may provide the address information to the input buffer 234, and may provide index information to the DTOPO circuit 230, which may provide the test sequence to the input buffer 234. Based on the address information provided from the WFIFO 234, the test sequence may be written to the memory cells specified by the address information.

During a read portion of a test, the BIST sequencer 228 may provide address information to retrieve a test sequence previously stored in the core die 206. Information may be read out from the memory cells specified by the address information to an output buffer 235 (e.g., a read FIFO (RFIFO)). The output buffer circuit 235 may generally be similar to the input buffer 234, except that the output buffer 235 may receive information from the core die 206 and then provides it on to other circuits of the interface die 204.

The interface die 204 may include an error catch memory (ECM) circuit 232 configured to generate error related results based on the read test sequence. The ECM circuit 232 may be coupled to the address information and test sequences provided to the input buffer 234, and include one or more registers (e.g., BIST registers and/or MISR output registers) used to store the written test sequences as well as address information. When a read operation is performed, the ECM circuit 232 may compare the read test sequence from the output buffer 235 to the test sequence which was written to those memory cells as part of an earlier write operation. The ECM circuit 232 may generate the results (e.g., indication of mismatches, failed memory cells, or the like) based on such comparison. The ECM circuit 232 may then provide the result information to the P1500 circuit 224, which may then provide the result information out of the memory over the P1500 uBumps 220 and/or the DA uBumps 216.

In addition to or as an alternative to the P1500 uBump 220, the memory device 200 can provide access to the core dies 206 through the DA ubump 216 (e.g., the DA bumps 116 of FIG. 1). The memory device 200 can be configured to provide direct accesses thereto, such as by bypassing other components of a SiP (e.g., such as the processor 110) through the DA bump 216. These DA uBumps 216 may, in some embodiments, be organized into a probe pad, where an external device (e.g., the external device 150) may be coupled to DA uBumps 216 in order to access the interface die 204 (and through it the core die 206). For example, the memory device 200 can communicate directly with an external tester through the DA uBumps 216 to implement a test. The signals may be communicated according to the P1500 interface protocol. Accordingly, the DA uBumps 216 may be used to implement the self-test described above for the P1500 uBump 220, such as by load information to/from test circuits (e.g., the DTOPO circuit 230 and/or the ECM circuit 232) through the DA uBumps 216. The test information may be communicated between the DA uBumps 216 and the P1500 circuit 224 and then communicated to/from the other circuits as described above.

As an illustrative example, the test sequences may be loaded into the self-test circuit (e.g., the BIST sequencer 228, the DTOPO circuit 230, the ECM 232, and/or one or more circuits illustrated in FIG. 2) through the DA uBumps 216. Each test sequence may represent a string of logical bits which may be provided (serially or in parallel) to the core die. The test sequence may have a number of bits to match the amount of data in one or more DWORDs. In an example operation, when the self-test circuit is loaded, a tester may provide a string of bits to the DA uBumps 216, which may be routed to the P1500 circuit 224. The P1500 circuit may then provide the string of bits to the self-test circuit, where the bits may be stored.

The DA uBumps 216 can facilitate functions/communications similar to the native uBumps 205, such as for testing purposes. The DA uBumps 216 may be used to communicate AWORDs and DWORDs in a manner similar to the native uBumps 205. In some embodiments, there may be fewer DA uBumps 216 than there are native uBumps 205. In order to mimic the operation of signals along the native uBumps 205, the interface die 204 can include a deserializer circuit 222. The deserializer circuit 222 may receive the AWORD and DWORD from the DA uBumps 216 and then split the received serial data into a number of parallel channels. In some embodiments, the deserializer circuit 222 may split the AWORD and DWORD into a number of parallel channels that correspond to the circuit paths associated with the native uBumps 205. In some embodiments, the interface die 204 may include a DA converter 226 configured to route the communicated information to the core die 206 for testing purposes.

Referring back to the testing capacity, the memory device 200 (at, e.g., the interface die 204) can include a test validation circuit 250 configured to validate the overall test. The test validation circuit 250 can validate whether the test (e.g., the self-test and/or the test implemented with the external device 150) executed accurately. In other words, the test validation circuit 250 can be configured to detect false passes. For example, a failure in the BIST sequencer 228 may prevent the memory device 200 from executing the self-test. Accordingly, the ECM circuit 232 would not implement any comparisons to catch any errors, thereby inadvertently indicating that the test passed. The test validation circuit 250 can prevent such failure modes by storing comparison/template data (e.g., the input stream or a portion thereof that was provided by the external device 150) and comparing it to the reporting stream to validate the self-test. The stored comparison data can be configured according to the manufacturer, the system requirement, the test details, or the like. Details regarding the test validation circuit 250 is described below.

Figure 3:
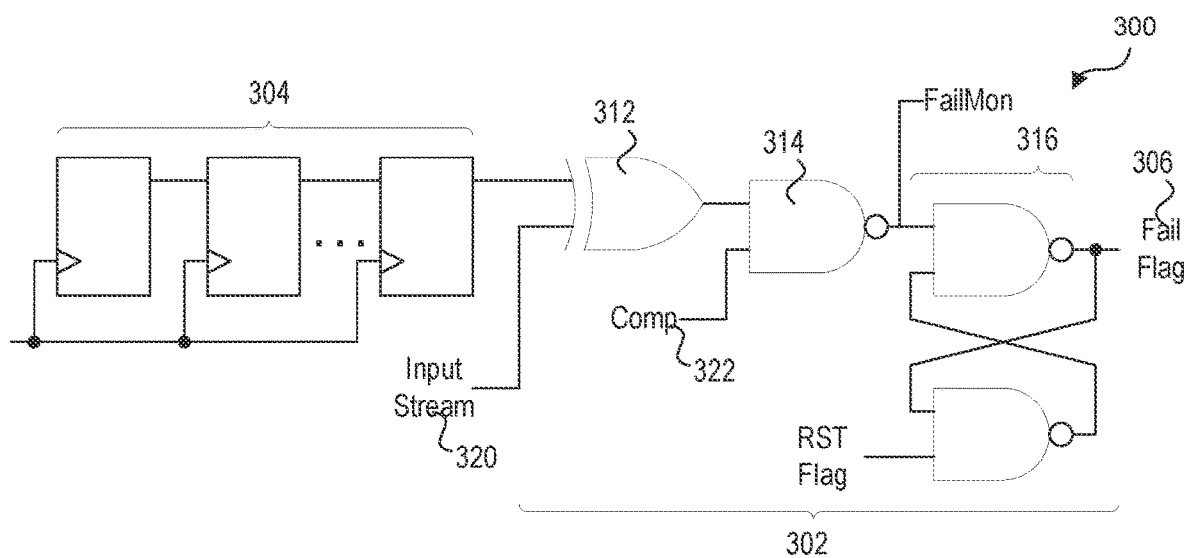
FIG. 3 is a schematic view of a first example test validation circuit in accordance with embodiments of the technology.

FIG. 3 is a schematic diagram of a first example test validation circuit 300 (e.g., the test validation circuit 250 of FIG. 2) in accordance with embodiments of the technology. The test validation circuit 300 can include an analysis circuit 302 coupled to a set of registers 304, such as the ECM circuit 232 of FIG. 2 or a portion thereof (e.g., the MISR and/or the BIST status registers), that correspond to an internal test outputs/results. The analysis circuit 302 can be configured to internally verify a status of a self-test, such as by comparing the test data stored in the set of registers 304 with an input stream 320 (e.g., data provided by the external device 150 of FIG. 1, such as through the DA uBump 216 of FIG. 2 and/or the P1500 uBump 220 of FIG. 2). For example, the analysis circuit 302 can provide a fail flag 306 when the test data from the set of registers 304 differ from the input stream 320. Accordingly, the analysis circuit 302 can detect/prevent one or more errors or failures, such as incorrect test implementations (e.g., false pass scenarios) and provide distinctions between errors caused by incorrect test implementations and errors caused by failure in the tested target. Alternatively or additionally, the compare results can be monitored directly using the external device 150, thereby providing granularity of a timing or an occurrence of mis-comparison events.

As an illustrative example, the analysis circuit 302 can include a comparison device 312, such as an XOR, coupled to the set of registers 304 (e.g., an output thereof) and the input stream 320. The comparison device 312 can compare the two inputs (e.g., a bit-wise comparison) and determine whether the two inputs match or differ from each other. The comparison device 312 can be coupled to an enable circuit 314 (e.g., a NAND) that also receives a comparison signal 322. The enable circuit 314 can be configured to allow the comparison result to proceed according to the comparison signal 322. The test validation circuit 250 and/or other circuits in the memory device 200 of FIG. 2 can include logic (not shown) that controls the comparison signal 322. Accordingly, the analysis circuit 302 can compare targeted portions of the test and/or the input stream 320. In other words, the enable circuit 314 can allow the output of the comparison device 312 to control the fail flag 306 when the comparison signal 322 is active. The output of the comparison device 312 can be blocked when the comparison signal 322 is inactive, thereby providing operational efficiency (by, e.g., reducing power consumption) for the memory device 200.

The output of the enable circuit 314 can be provided as a fail monitor signal in real-time to one or more circuits. For example, the fail monitor signal can be provided to the external device 150 through an output pin to provide visibility into the portions of the stream that caused failure. The fail monitor signal may be used to analyze the failure separately or in addition to the analysis using the fail flag 306 (e.g., analysis without real-time monitoring or an unchanging or "sticky" bit failure mode).

The analysis circuit 302 can include a reset circuit 316 coupled to the enable circuit. The reset circuit 316 can be configured to reset the fail flag 306 according to a reset flag. For example, the fail flag 306 can notify the memory device 200, the external device 150, and/or the test operator that the self-test or a specific portion thereof may not have been implemented as intended. The reset circuit 316 can be used to reset the fail flag 306 to continue subsequent portions of the same test, to implement a different test, and/or to test a different device.

Figure 4:
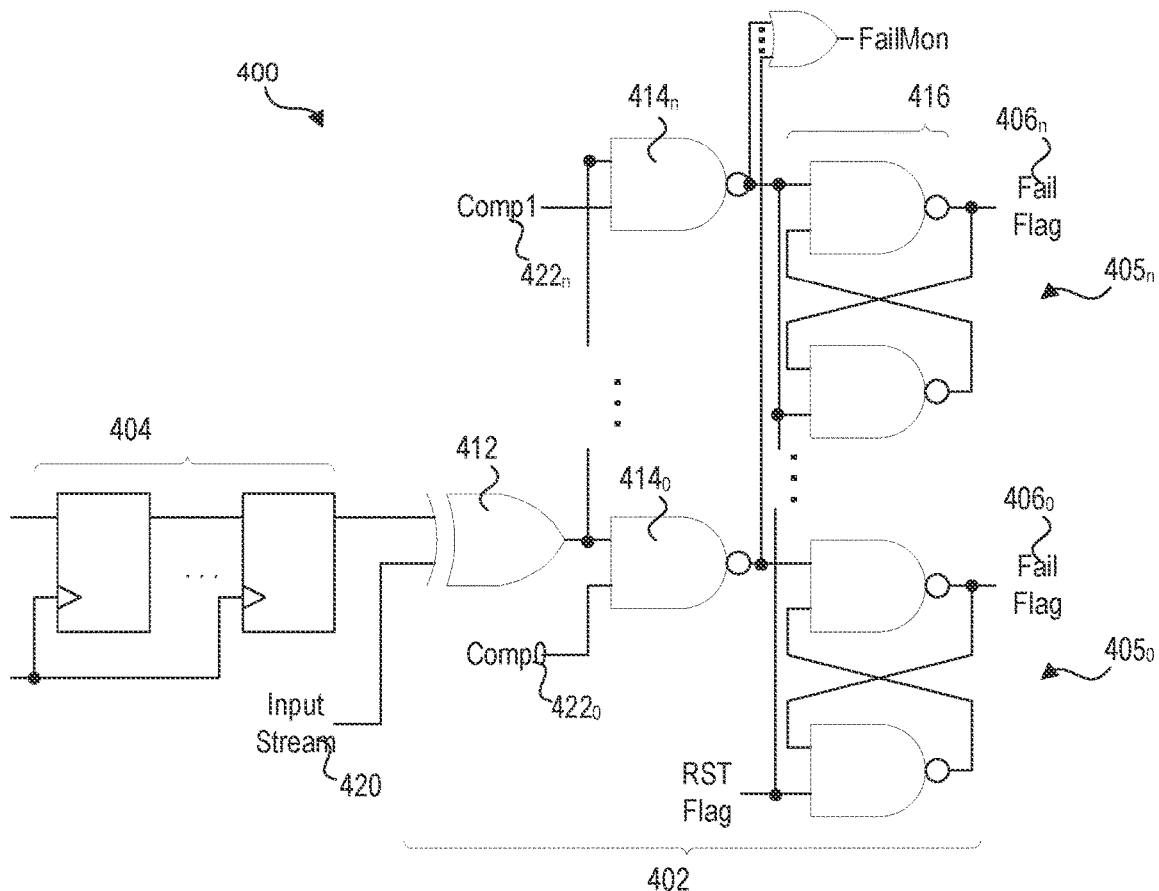
FIG. 4 is a schematic view of a second example test validation circuit in accordance with embodiments of the technology.

FIG. 4 is a block diagram of a second example test validation circuit 400 (e.g., the test validation circuit 250 of FIG. 2) in accordance with embodiments of the technology. The test validation circuit 400 can be configured to independently compare multiple portions of a test. The test validation circuit 400 can include an analysis circuit 402 coupled to a set of registers 404. Similar to the test validation circuit 300 of FIG. 3, the analysis circuit 402 can include a comparison device 412, such as an XOR, coupled to the set of registers 404 (e.g., an output thereof) and an input stream 420. The comparison device 412 can be configured to determine whether the two inputs match or differ from each other.

The analysis circuit 402 can include circuit segments $405_0$-$405_n$ configured to control analysis of separate portions of a test (e.g., between reset flag adjustments). For example, the circuit segments $405_0$-$405_n$ can include a set of enable circuits $414_0$-$414_n$ that each receives a corresponding one of comparison signals $422_0$-$422_n$. Each of the enable circuits $414_0$-$414_n$ can be configured to allow the comparison results to proceed according to the corresponding one of the comparison signals $422_0$-$422_n$, thereby respectively generating fail flags $406_0$-$406_n$. The control logic (not shown) can activate the comparison signals $422_0$-$422_n$ at different portions/times of the self-test and capture the comparison results (e.g., the fail flags $406_0$-$406_n$) at different portions or times of the self-test.

In some embodiments, the comparison results from the set of enable circuits $414_0$-$414_n$ can represent a fail monitor signal configured to facilitate real-time failure capture/analysis. For example, the comparison results can be combined by an OR circuit. As such, the test validation circuit 400 can notify in real-time that an error has occurred. The fail monitor signal can be provided to one or more circuits (e.g., the external device 150 through an output pin) to provide real-time visibility into the portions of the stream/test that caused failure. The fail monitor signal may be used to analyze the failure separately or in addition to the analysis using the fail flag 306 (e.g., analysis without real-time monitoring or an unchanging or "sticky" bit failure mode).

The analysis circuit 402 can include reset circuitry 416 configured to reset the fail flags $406_0$-$406_n$. In some embodiments, the reset circuitry 416 can include portions that each correspond to the circuit segments $405_0$-$405_n$. The reset circuitry 416 can be controlled according to a reset flag such that the portions each reset a corresponding one of the fail flags $406_0$-$406_n$. In other words, the reset circuitry 416 can reset the fail flags $406_0$-$406_n$ according to the reset flag.

FIG. 5 is a flow diagram illustrating an example method 500 of operating an apparatus (e.g., the SiP 100 of FIG. 1, the memory device 102 of FIG. 1, the memory device 200 of FIG. 2, the test validation circuit 300 of FIG. 3, the test validation circuit 400 of FIG. 4, a portion thereof, or a combination thereof) in accordance with an embodiment of the present technology. The method 500 can include validating the implementation of a self-test process.

At block 502, the apparatus can receive an input stream (e.g., the input stream 320 of FIG. 3 and/or FIG. 4) from an external device for a self-test process. For example, the memory device 102/200 can receive the input stream 320 from the external device 150 of FIG. 1 through the DA uBump 216 of FIG. 2 and/or the P1500 uBump 220 of FIG. 2.

At block 504, the apparatus can access a set of registers (e.g., the set of registers 304 of FIG. 3 and/or FIG. 4) associated with the self-test. For example, content of the set of registers 304 can be accessed by or provided to the comparison device 312 of FIG. 3 and/or FIG. 4 (e.g., an XOR device). The content from the set of registers may correspond to test data (e.g., intermediate communication data) associated with the self-test process. The stored test data may match one or more targeted portions of the input stream when the self-test process is implemented or executed correctly.

At block 506, the apparatus can generate status flag(s) (e.g., the fail flag 306 of FIG. 3 and/or the fail flags $406_0$-$406_n$ of FIG. 4) for the self-test. As an illustrative example, at block 512, the comparison device 312 can compare (via, e.g., an XOR comparison or another bit-wise comparison) content from the set of registers to the input stream. The comparison device 312 can generate comparison result(s) based on comparing a content of the set of registers to the input stream. The comparison result(s) can correspond to the status flag(s) and represent a validity associated with the implementation of the self-test process or corresponding portions thereof. In some embodiments, the comparison device 312 can determine whether the self-test process or a portion thereof was implemented correctly. In other words, the comparison device 312 can detect an inaccurate or a false pass result caused by an erroneous implementation or a non-implementation of the self-test process.

At block 514, the apparatus (e.g., the comparison device 312) can receive comparison signal(s), such as at the enable circuit 314 of FIG. 3 and/or the set of enable circuits $414_0$-$414_n$ of FIG. 4. The comparison signal(s) can be used to identify and/or select corresponding targeted portion(s) of the content of the set of registers and the input stream.

At block 516, the apparatus can generate the status flag(s) based on the comparison signals(s). The test validation circuit 300/400 can generate the status flag(s) based on determining whether the targeted portion(s) of the content of the set of registers and the input stream match. In some embodiments, the test validation circuit 400 can generate multiple flags (e.g., the fail flags $406_0$-$406_n$) based on comparing and evaluating multiple targeted portions during a self-test process (e.g., between flag resets).

At block 508, the apparatus can communicate the status flag(s) to the external device. For example, the test validation circuit 300/400 can send the status flag(s) to the external device 150 through one or more of the uBumps described above. The test validation circuit 300/400 can send the status flag(s) instead of the content of the set of registers 304. In other words, the test validation circuit 300/400 can perform an intermediate analysis of the self-test process and provide the analysis result as a summary that has smaller size than the analyzed data. In some embodiments, the status flag(s) can indicate whether the self-test process was correctly implemented/executed.

At block 510, the apparatus can reset the status flag(s), such as at the end of one self-test process or at predetermined times within a self-test process. The memory device 200 can control the reset flags to reset the status flag(s). In some embodiments, the memory device 200 can use a common reset flag to reset multiple status flags (e.g., the fail flags $406_0$-$406_n$).

FIG. 6 is a flow diagram illustrating an example method 600 of manufacturing an apparatus (e.g., the memory device 102 of FIG. 1, the memory device 200 of FIG. 2, a portion thereof, or a combination thereof) in accordance with an embodiment of the present technology. The method 600 (e.g., the providing processes) may include forming the test validation circuit 300 of FIG. 3, the test validation circuit 400 of FIG. 4, a portion thereof, or a combination thereof, such as through semiconductor manufacturing processes (e.g., doping, masking, removing/etching, or the like).

At block 602, the method 600 can include providing functional circuitry (e.g., the core die 206 of FIG. 2 and/or one or more portions of the interface die 204 of FIG. 2). For example, one or more dies may be manufactured including the memory array, the RAM device, or the like. Also, one or more circuits of the interface die 204 can be formed on a silicon substrate.

At block 604, the method 600 can include providing self-test circuitry. For example, the semiconductor substrate for the interface die 204 can be processed to form the P1500 circuit 224 of FIG. 2, the BIST sequencer 228 of FIG. 2, the ECM circuit 232 of FIG. 2, or the like. Providing the self-test circuitry can include forming the set of registers 304 of FIG. 3 and/or FIG. 4 as illustrated in block 612.

At block 606, the method 600 can include forming a test validation circuit. The semiconductor substrate for the interface die 204 can be processed to form the test validation circuit 250 of FIG. 2, such as the test validation circuit 300 of FIG. 3 or the test validation circuit 400 of FIG. 4 (e.g., the analysis circuits thereof).

As an illustrated example, at block 622, the method 600 can include providing a comparison device (e.g., an XOR device). The comparison device can be coupled and/or configured to compare the test data or the content stored in the set of registers 304 with the input stream 320. At block 624, the method 600 can include connecting enable circuit (s) (e.g., the enable circuit 314 of FIG. 3 or the enable circuits $414_0$-$414_n$ of FIG. 4) to the comparison device. At block 626, the method 600 can include connecting a reset circuit (e.g., the reset circuit 316 of FIG. 3 or the reset circuitry 416 of FIG. 4) to the comparison device.

At block 608, the method 600 can include forming external connectors, such as the DA uBump 216 of FIG. 2, the P1500 uBump 220 of FIG. 2, etc. The method 600 can thus form or provide the HBM interface die 204 and/or the memory device 102/200.

In some embodiments, the memory device 102/200 can be provided with the test validation circuit therein. The provided memory device can be processed to form the SiP 100 of FIG. 1, such as by mounting the memory device on the interposer 112 of FIG. 1, mounting the processor 110 of FIG. 1 to the interposer 112, etc.

Figure 7:
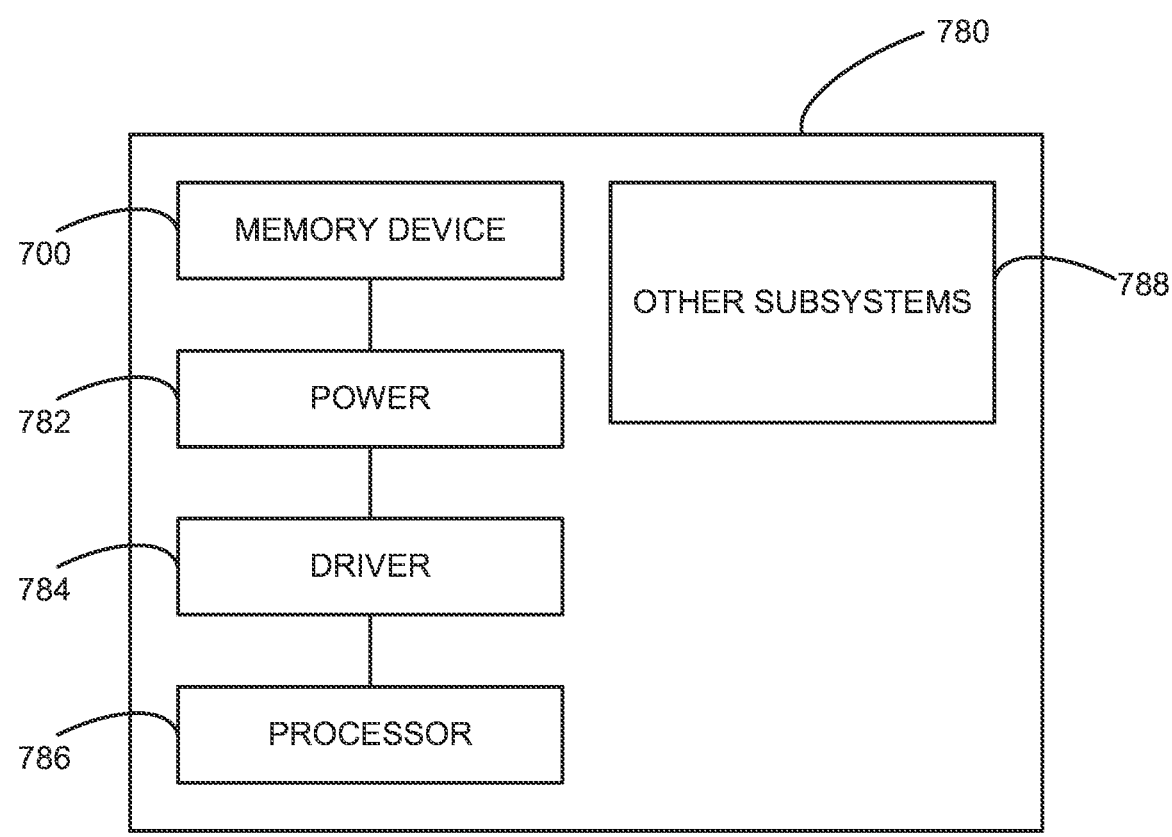
FIG. 7 is a block diagram of a system that includes an apparatus configured in accordance with embodiments of the present technology.

FIG. 7 is a block diagram of a system that includes an apparatus in accordance with embodiments of the present technology. Any one of the foregoing apparatuses (e.g., memory devices) described above with reference to FIGS. 1-6 can be incorporated into or implemented in memory (e.g., a memory device 700) or any of a myriad of larger and/or more complex systems, a representative example of which is system 780 shown schematically in FIG. 7. The system 780 can include the memory device 700, a power source 782, a driver 784, a processor 786, and/or other subsystems or components 788. The memory device 700 can include features generally similar to those of the apparatus described above with reference to FIGS. 1-6 and can therefore include various features for performing a direct read request from a host device. The resulting system 780 can perform any of a wide variety of functions, such as memory storage, data processing, and/or other suitable functions. Accordingly, representative systems 780 can include, without limitation, hand-held devices (e.g., mobile phones, tablets, digital readers, and digital audio players), computers, vehicles, appliances and other products. Components of the system 780 may be housed in a single unit or distributed over multiple, interconnected units (e.g., through a communications network). The components of the system 780 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of HBM and DRAM devices. Apparatuses configured in accordance with other embodiments of the present technology, however, can include other types of suitable storage media in addition to or in lieu of HBM and/or DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-7.

What is claimed is:

1. An apparatus, comprising:
   a self-test circuit configured to implement a self-test process or a portion thereof to determine operating conditions of the apparatus, wherein the self-test process includes (1) receiving an input stream from an external device and (2) storing test data at a predetermined location;
   an external connector coupled to the self-test circuit and configured to provide an interface between the apparatus and the external device; and
   a test validation circuit coupled to the self-test circuit and the external connector, the test validation circuit configured to generate a flag based on comparing the input stream or a portion thereof to content stored at the predetermined location, wherein the flag represents a validity associated with the implementation of the self-test process or the portion thereof.

2. The apparatus of claim 1, wherein the test validation circuit is configured to provide the flag instead of the content stored at the predetermined location, wherein the flag is accessed by the external device through the external connector and corresponds to fewer bits than the compared portions of the content stored at the predetermined location.

3. The apparatus of claim 1, wherein the predetermined location includes a set of registers configured to internally store the test data, wherein the test validation circuit is coupled to and located between the set of registers and the external connector.

4. The apparatus of claim 1, wherein the test validation circuit is configured to generate a comparison output based on performing a bit-wise comparison between the input stream and the content stored at the predetermined location.

5. The apparatus of claim 4, wherein the test validation circuit includes an XOR device.

6. The apparatus of claim 4, further comprising:
   an enable circuit coupled to the test validation circuit and configured to generate the flag based on a comparison signal, wherein the enable circuit uses the comparison signal to generate the flag representative of a comparison of one or more targeted portions of the input stream and the content stored at the predetermined location.

7. The apparatus of claim 6, further comprising:
   an output path electrically coupled to an output of the enable circuit, wherein
      the output of the enable circuit comprises a fail monitor signal representative of a real-time output of the comparison of one or more targeted portions of the input stream and the content stored at the predetermined location, and
      the output path is configured to provide the fail monitor signal to the external device in real-time.

8. The apparatus of claim 6, wherein the enable circuit comprises a first enable circuit, the flag comprises a first flag, and the flag is a first flag representative of the comparison between a first targeted portion of the input stream and the content stored at the predetermined location, the apparatus further comprising:
   a second enable circuit coupled to the test validation circuit and configured to generate a second flag based on a second comparison signal, wherein the second enable circuit uses the second comparison signal to generate the second flag representative of a comparison between a second targeted portion of the input stream and the content stored at the predetermined location.

9. The apparatus of claim 8, further comprising:
   a reset circuit coupled to the first enable circuit and the second enable circuit, the reset circuit configured to reset the first and second flags based on a reset flag.

10. The apparatus of claim 8, further comprising:
    an OR circuit configured to (1) receive a first output from the first enable circuit and a second output from the second output circuit and (2) generate a fail monitor signal based on a logical OR operation of the received signals, wherein the fail monitor signal represents a real-time output of the comparisons of the targeted portions of the input stream and the content stored at the predetermined location.

11. The apparatus of claim 1, wherein:
    the apparatus comprises a memory device configured to store data;
    the self-test process is configured to validate a capability of the memory device to read and write data; and
    the flag is configured to represent whether the self-test process was implemented accurately and is separate from a result of the self-test process.

12. The apparatus of claim 11, wherein the test validation circuit is configured to detect an inaccurate pass result caused by an erroneous implementation or a non-implementation of the self-test process.

* * * * *